United States Patent
Taniguchi et al.

(10) Patent No.: US 6,404,062 B1
(45) Date of Patent: Jun. 11, 2002

(54) SEMICONDUCTOR DEVICE AND STRUCTURE AND METHOD FOR MOUNTING THE SAME

(75) Inventors: Fumihiko Taniguchi; Sachiko Nogami; Akira Takashima, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/492,391

(22) Filed: Jan. 27, 2000

(30) Foreign Application Priority Data

Mar. 5, 1999 (JP) .......................................... 11-058963

(51) Int. Cl.[7] ........................ H01C 23/48; H01C 23/52; H01C 25/40
(52) U.S. Cl. ........................ 257/778; 257/777; 257/686; 257/780; 438/108; 438/109
(58) Field of Search ................................ 257/778, 772, 257/780, 781, 698, 701, 777, 686; 438/125, 108, 109

(56) References Cited

U.S. PATENT DOCUMENTS

| | | | | |
|---|---|---|---|---|
| 5,477,082 A | * | 12/1995 | Buckley, III et al. | |
| 5,834,835 A | * | 11/1998 | Mackawa | |
| 5,869,894 A | * | 2/1999 | Degani et al. | |
| 6,122,171 A | * | 9/2000 | Akram et al. | |
| 6,150,724 A | * | 11/2000 | Wenzel et al. | |
| 6,229,215 B1 | * | 5/2001 | Egawa | |

FOREIGN PATENT DOCUMENTS

| | | | |
|---|---|---|---|
| EP | 0 210 371 | * | 11/1990 |
| JP | 1-191457 | | 8/1989 |
| JP | 2-278872 | * | 11/1990 |
| JP | 6-85005 | | 3/1994 |
| JP | 8-181171 | | 7/1996 |
| JP | 9-120976 | | 5/1997 |

* cited by examiner

Primary Examiner—Sheila V. Clark
(74) Attorney, Agent, or Firm—Armstrong, Westerman & Hattori, LLP

(57) ABSTRACT

A semiconductor device includes a semiconductor chip, solder balls, a printed wiring substrate on which the semiconductor chip is provided and which serves to electrically connect the semiconductor chip and the solder balls. When such a semiconductor device is mounted on a motherboard, at least one through-aperture is in advance formed on the printed wiring substrate oppositely to the semiconductor chip. After the solder balls are soldered to the motherboard, an under-filler is introduced from either of a space between the semiconductor chip and the printed wiring substrate or a space between the printed wiring substrate and the motherboard, thus flowing from one space into the other space via the through-aperture.

10 Claims, 9 Drawing Sheets

SEMICONDUCTOR DEVICE AND STRUCTURE AND METHOD FOR MOUNTING THE SAME

BACKGROUND OF THE INVENTION

1. Field of the Invention

The present invention generally relates structures and methods for fabricating semiconductor devices, and more particularly to a structure and a method for mounting a flip-chip semiconductor device in which an under-filler is introduced into a space between a semiconductor chip and an wiring layer and a space between the wiring layer and a mounting substrate such as a printed circuit board.

In recent years, with increasing demand for miniaturization, lightweight and thinness of electronic apparatuses, semiconductor devices, which are used therein, have been produced smaller, lighter and thinner. For this reason, semiconductor devices, which are package types such as BGA (Ball Grid Array), CSP (Chip Size Package), MCM (Multi Chip Module) and the like, have been developed.

With regard to internal connecting we processes thereof, a wire bonding process and a flip-chip mounting process are generally employed.

It is predicted, however, that the flip-chip mounting process is becoming the mainstream in terms of its supporting area-pads and multi-bins and of being available to shorten lengths of wires.

It should be noted that, by the flip-chip mounting process, a plurality of protruding electrodes are formed on a surface of a semiconductor chip on which various semiconductor elements are formed and the electrodes are connected to an interconnecting substrate in a face-down state. In such a face-down state, however, since the protruding electrodes directly receive a stress resulting from a difference in thermal expansion coefficients between the semiconductor chip and the interconnecting substrate, there brings about a problem that the protruding electrodes cannot stand such a stress, for example, in a temperature cycling test or the like.

In general, after the flip-chip mounting process is completed, an under-filler is introduced into a space between the semiconductor chip and the interconnecting substrate so as to increase a contact area therebetween and relax the stress applied to the protruding electrodes. Mostly, with respect to flip-chip type semiconductor devices such as BGA, CSP and MCM, during a secondary mounting for mounting them on the printed circuit board, the further under-filler is introduced into the space therebetween so that connecting reliability can be ensured after the secondary mounting.

2. Description of the Related Art

FIG. 1A shows a conventional semiconductor device 10A. FIG 1B shows a state in which the semiconductor device 10A is mounted on a motherboard 19 serving as the printed circuit board.

As shown in FIG. 1A, the semiconductor device 10A is a BGA-and-CSP package type semiconductor device, and generally comprises a semiconductor chip 11, a flexible printed substrate 12, a plurality of solder balls 13, and a first under-filler layer 18.

The semiconductor chip 11 has a circuit-forming surface (a bottom surface thereof in diagrams) on which a plurality of bumps 14 are provided. The bumps 14 are respectively soldered to a plurality of bonding pads 16 of the flexible printed substrate 12, which serves as an wiring substrate.

Thus, the semiconductor chip 11 is mounted on the flexible printed substrate 12 in a face-down state by a flip-chip mounting process (a primary mounting).

Further, on the flexible printed substrate 12 are formed a plurality of connecting holes 17, positions of which are determined by respective connecting positions of the solder balls 13 to be described later. Moreover, on the flexible printed substrate 12 are formed wiring patterns 15, each having one end integrally connected to the bonding pad 16 and the other end connected to a connector plug filling the connecting hole 17.

The solder balls 13 serve as connecting terminals and are soldered to a surface opposite to a chip-carrying surface of the flexible printed substrate 12. The solder balls 13 are connected to the wiring patterns 15 through the connecting holes 17, respectively. Accordingly, the semiconductor chip 11 and the solder balls 13 are electrically connected over the flexible printed substrate 12, which serves as the interconnecting substrate.

Also, the first under-filler layer 18 is formed by introducing the under-filler, which is formed of resin, into a space between the semiconductor chip 11 and the flexible printed substrate 12. Thus, by forming the first under-filler resin layer 18 in the space therebetween, the bumps 14 can be reinforced. Accordingly, the bumps 14 can be prevented from being detached from the flexible substrate 12, even though a stress resulting from the difference in thermal expansion coefficient therebetween is applied thereto.

The previously described semiconductor device 10A, as shown in FIG. 1B, is mounted on the motherboard 19 by soldering the solder balls 13 to respective connecting electrodes 21 thereof. This is regarded as a secondary mounting. During the secondary mounting, the under-filler is introduced into a space between the flexible printed substrate 12 and the motherboard 19 so as to form a second under-filler resin layer 20 therewithin. Thus, connection reliability of the solder balls 13 can be improved.

A semiconductor device 10B shown in FIG. 2A, similar to the semiconductor device 10A shown in FIG. 1A, is a face-down semiconductor device belonging to the conventional BGA and CSP types. However, the semiconductor device 10B is provided with a printed wiring substrate 23 instead, serving as the interconnecting substrate.

The semiconductor chip 11 is, in a face-down state, connected to the printed wiring substrate 23, upon which a plurality of the bonding pads 16 are formed, whereas under which a plurality of boll pads 22 are formed. The bonding pads 16 and the ball pads 22 are connected through not-shown through-holes.

The bonding pads 16 are connected to the semiconductor chip 11 via the respective bumps 14. In order to relax the stress applied to these bumps 14, the under-filler resin is introduced into a space between the semiconductor chip 11 and the printed wiring substrate 23 so as to form the first under-filler layer 18. Further, the solder balls 13 are respectively soldered to the ball pads 22 which are formed on the lower surface of the printed wiring substrate 23. Thus, the semiconductor chip 11 and the solder balls 13 are electrically connected by the printed wiring substrate 23 serving as the interconnecting substrate.

By soldering the solder balls 13 to the respective connecting electrodes 21 of the motherboard 19, the previously described semiconductor device 10B, as shown in FIG. 2B, is mounted thereon. This is regarded as the secondary mounting. During the secondary mounting, the under-filler resin is introduced into a space between the printed wiring substrate 23 and motherboard 19 so as to form the second under-filler resin layer 20 therewithin. Thereby, the connection reliability of the solder balls 13 can be improved.

FIGS. 3 through 6 are diagrams showing a conventional method for producing a semiconductor device and a conventional method for mounting the same. The semiconductor device 10B, which have been described with reference to FIG. 2, is now used as an example in the following description of the conventional methods.

FIG. 3A is a flowchart showing the method for producing the semiconductor device 10B. The producing method proceeds as follows.

Firstly, at Step 10 ("Step" simply referred as to "S" in the diagrams), a well-known producing process is performed on a wafer so as to produce a plurality of the semiconductor chips 11 thereon. And then, at Step 11, a bump-forming process is performed so as to form a plurality of the bumps 14 on the semiconductor chips 11 which have been produced at Step 10. Thereafter, at Step 12, a dicing process is performed to dice the wafer so as to individualize the semiconductor chips 11 thereon.

In addition, at Step 13, a separate process is in advance performed so as to form the printed wiring substrate 23 serving as the interconnecting substrate. Then, at Step 14, a flip-chip mounting process is performed so as to mount the semiconductor chip 11 on the printed wiring substrate 23. Thereafter, at Step 15, an under-filler introducing process is performed for introducing the under-filler resin into the space between the semiconductor chip 11 and the printed wiring substrate 23 so as to form the first under-filler resin layer 18 therewithin.

After the introducing process is completed, at Step 16, a soldering process is performed so as to solder a plurality of the solder balls 13 under the printed wiring substrate 23. Then, at Step 17, a cleaning process is performed so as to remove solder pastes used at Step 16. Thereafter, the semiconductor device 10B is produced at Step 18. Thus, the conventional method for producing the semiconductor device 10B is completed.

FIG. 3B is a flowchart showing the conventional method for mounting the semiconductor device 10B, which is produced as described previously, on the motherboard 19 serving as the printed circuit board. The mounting method proceeds as follows.

At Step 20, a separate process is in advance performed so as to produce the motherboard 19.

At Step 21, a solder-paste is printed so that the solder paste is provided on the connecting electrodes 21 formed on the motherboard 19. Then, as Step 22, a carrying process is perform as shown in FIG. 4 so as to carry the semiconductor device 10B on the motherboard 19 by carrying the solder balls 13 on the respective connecting electrodes 21 with the solder pastes serving as adhesives printed thereon. This carrying process is regarded as a temporary mounting process.

At Step 23, a soldering process is performed such that the semiconductor device 10B, which is thus carried on the motherboard 19, is put into a reflow furnace so as to solder the solder balls 13 to the respective connecting electrodes 21. By Step 23, the semiconductor device 10B is firmly carried on the motherboard 19 as shown in FIG. 5. Thereafter, at Step 24, the cleaning process is performed so as to remove the solder pastes.

As shown in FIG. 5, after Steps 23 and 24 are completed, a space 24 is formed between the printed wiring substrate 23 and motherboard 19. Therefore, at Step 25, an under-filler introducing process is performed for introducing the under-filler resin into the space 24 therebetween so as to form the second under-filler resin layer 20.

FIG. 6 shows a state where the under-filler used to form the second under-filler resin layer 20 is being introduced into the space 24 therebetween. And when the second under-filler layer 20 is completely formed within the space 24, the method for mounting the semiconductor device 10B on the motherboard 19 is finished.

In addition, with respect to the semiconductor device 10A shown in FIG. 1, it can be produced and mounted by the same methods as described with reference to FIGS. 3 through 6, only except the printed wiring substrate 23 is replaced with the flexible printed substrate 12.

However, according to the conventional producing and mounting methods, the under-filler introducing process is performed two times, one time at Step 15 of the producing method where the under-filler is introduced to form the first under-filler resin layer 18, the other time at Step 25 of the mounting method where the under-filler is introduced to form the second under-filler resin layer 20.

In other words, conventionally, the first under-filler layer 18 and the second under-filler layer 20 are formed separately by the two separate processes. For this reason, the producing and mounting of the semiconductor device 10B becomes complicated on the whole and thereby brings about a problem of an increase in the costs thereof.

Further, according to the conventional method, after the first under-filler resin layer 18 is formed at Step 15, the soldering process is performed at Step 16 and Step 23. Further, with respect to the flip-chip type BGA, CSP and MCM semiconductor devices, the semiconductor chip 11 thereof is connected in the facedown state and the under-filler used to form the first under-filler resin layer 18 is introduced into the space between the semiconductor chip 11 and the interconnecting substrate (the flexible printed substrate 12 or the printed wiring substrate 23).

For the above-mentioned reasons, in a case where the interconnecting substrate is formed of a water-tight material, during the above-mentioned soldering process, water contained in the first under-filler resin layer 18 is heated and changed into water vapor. Since the water vapor has not a path to flee efficiently, there may bring about a problem that a popcorn phenomenon (an air-bladder phenomenon) occurs. When the popcorn phenomenon occurs, at the worst, cracks may occur between the semiconductor chip 11 or the interconnecting substrate and the first under-filler layer 18, and as a result, mounting reliability is deteriorated.

SUMMARY OF THE INVENTION

It is a general object of the present invention to provide a mounting structure and a mounting method of a semiconductor device, in which the above problems are eliminated.

Another and more specific object of the present invention is to provide a mounting structure and a mounting method of a semiconductor device, which can realize simplification of the producing and mounting thereof.

Still another object of the present invention is achieved by a semiconductor device comprising: a semiconductor chip having a device surface; an interconnecting substrate carrying said semiconductor chip in a face-down state, such that said device surface faces a top surface of said interconnection substrate with a gap formed between said device surface and said top surface; a plurality of connecting terminals provided on a bottom surface of said interconnecting substrate; and at least one through-aperture formed in said interconnecting substrate so as to penetrate from said bottom surface to said top surface, said through-aperture being formed in an area of said interconnecting substrate and covered by said semiconductor chip.

Still another object of the present invention is achieved by a structure for mounting a semiconductor device, the semiconductor device comprising a semiconductor chip having a device surface; an interconnecting substrate carrying said semiconductor chip in a face-down state, such that said device surface faces a top surface of said interconnection substrate with a gap formed between said device surface and said top surface; a plurality of connecting terminals provided on a bottom surface of said interconnecting substrate; at least one through-aperture formed in said interconnecting substrate so as to penetrate from said bottom surface to said top surface, said through-aperture being formed in an area of said interconnecting substrate and covered by said semiconductor chip; a main substrate to which said connecting terminals face; and a first under-filler layer formed between said semiconductor chip and said interconnecting substrate and a second under-filler layer formed between said interconnecting substrate and said main substrate, communicating with each other via said through-aperture.

Still another object of the present invention is achieved by a method for mounting a semiconductor device on a mounting substrate, the semiconductor device comprising a semiconductor chip having a device surface; an interconnecting substrate carrying said semiconductor chip in a face-down state, such that said device surface faces a top surface of said interconnection substrate with a gap formed between said device surface and said top surface; a plurality of connecting terminals provided on a bottom surface of said interconnecting substrate; and a main substrate to which said connecting terminals face; the mounting method comprising the step of:

forming at least one through-aperture in said interconnecting substrate so as to penetrate from said bottom surface to said top surface, said through-aperture being formed in an area of said interconnecting substrate and covered by said semiconductor chip;

connecting said connecting terminals of said semiconductor device to said main substrate; and introducing an under-filler from one of a space between said semiconductor chip and said interconnecting substrate and a space between said interconnecting substrate and said main substrate, and thereby introducing said under-filler layer into the other space via said through-aperture.

Other objects, features and advantages of the present invention will become more apparent from the following detailed description when read in conjunction with the accompanying drawings.

DETAILED DESCRIPTION OF THE PREFERRED EMBODIMENTS

A description will now be given of a first embodiment of the present invention.

Figure 7:
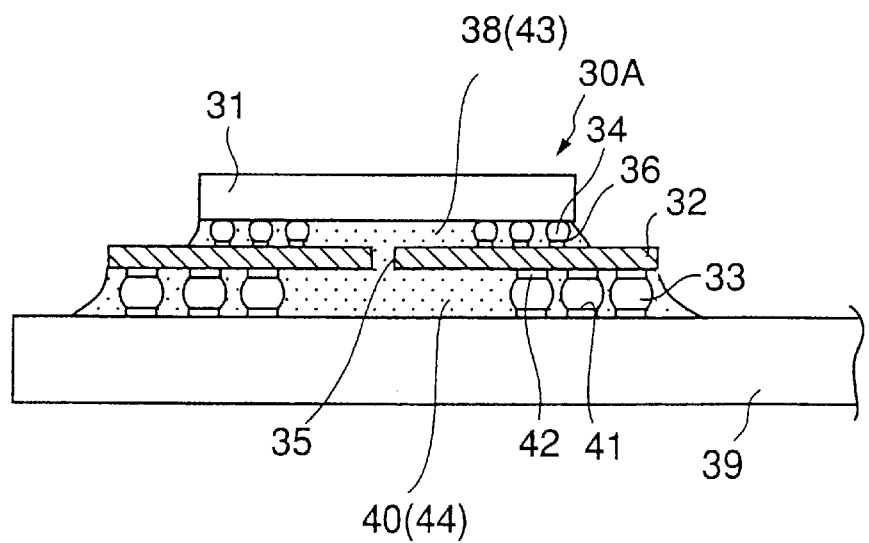
FIG. 7 is a diagram showing a mounting structure of a semiconductor device of a first embodiment according to the present invention.

FIG. 7 shows a mounting structure for a semiconductor device of the first embodiment according to the present invention. As shown in this diagram, in the mounting structure, a semiconductor 30A is mounted on a motherboard 39 serving as a printed circuit board.

The semiconductor device 30 is a CSP type semiconductor device and generally comprises a semiconductor chip 31 having a BGA structure of the electrodes 31, a printed wiring substrate 32, a plurality of solder balls 33 serving as connecting terminals, and a first under-filler layer 40.

The semiconductor chip 31 has a circuit-forming surface on which a plurality of bumps 34 are provided as shown in FIG. 7. The bumps 34 may be solder bumps, stud bumps or the like. The bumps 34 are provided on respective bonding pads 36 of the printed wiring substrate 32 and serve as protruding electrodes. Thereby, the semiconductor chip 31 is mounted in a face-down state on the printed wiring substrate 32 by way of a flip-chip mounting process. This is regarded as a primary mounting.

Figure 9:
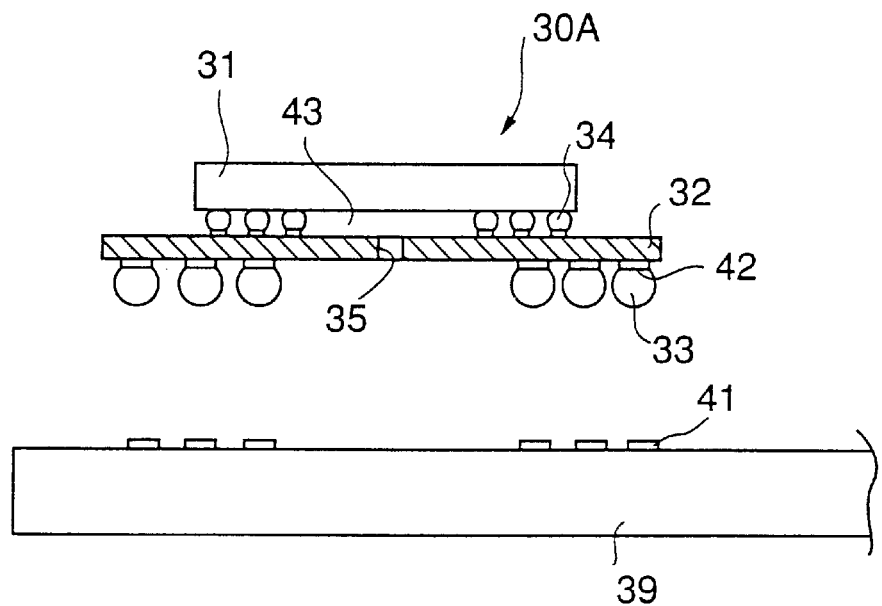
FIGS. 9 through 11 are diagrams showing the mounting method of the semiconductor device of FIG. 7 according to the present invention.

As shown in FIG. 9, the semiconductor chip 31 is mounted on the printed wiring substrate 32 in the face-down state (the primary mounting). At the time of completion of the primary mounting, a first space 43 is formed between the semiconductor chip 31 and the printed wiring substrate 32.

Referring back to FIG. 7, with respect to the printed wiring substrate 32, a plurality of the bonding pads 36 are provided thereon and a plurality of ball pads 42 are provided thereunder. The bonding pads 36 and the ball pads 42 are connected via not-shown through-holes.

Further, the printed wiring substrate 32 has a through-aperture 35 thereon, which is formed in a position opposite to the semiconductor chip 31. In other words, the through-aperture 35 is formed in the area of the substrate 32 covered by the semiconductor chip 31. The through-aperture 35 is configured to go through the printed wiring substrate 32. In this embodiment, only one through-aperture is provided thereon facing to the center of the semiconductor chip 31.

However, the through-aperture 35 may be formed in another position of the printed wiring substrate 32, which is just even apposite to the semiconductor chip 31. As will be described later, however, it is desired to form the through-aperture 35 on the center position thereof. Also, in this embodiment, only one through-aperture 35 is formed, but the present invention is not limited to this and a plurality thereof may be formed on the printed wiring substrate 32.

On the other hand, the bonding pads 36 are connected to the semiconductor chip 31 via the respective bumps 34, and the solder balls 33 are soldered to the respective ball pads 42 which are provided under the printed wiring substrate 32. Accordingly, the semiconductor chip 31 and the solder balls 33 are thus electrically connected to the printed wiring substrate 32.

Figure 10:
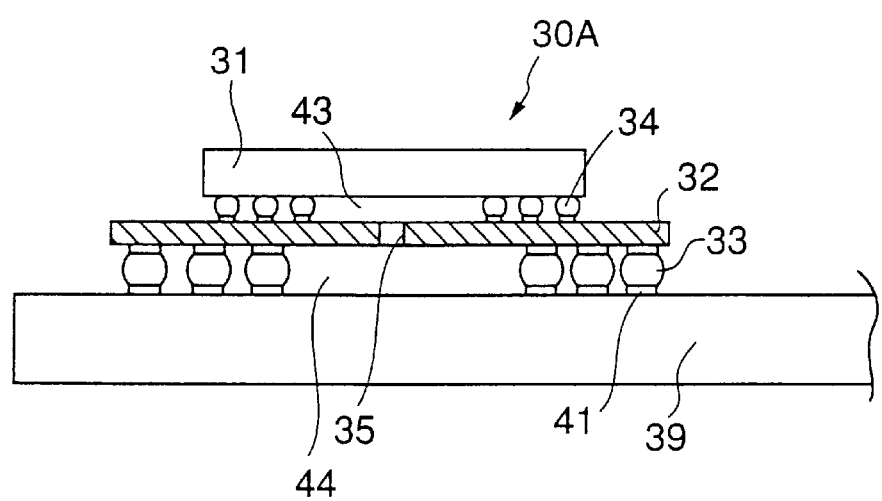

As shown in FIG. 10, by soldering the solder ball 33 to respective connecting electrodes 41 of a motherboard 39, the above-mentioned semiconductor 30A is thus mounted thereon. This is regarded as a secondary mounting. The secondary mounting forms a second space 44 between the printed wiring substrate 32 and the motherboard 39.

Also, after the secondary mounting, as will be described later, an under-filler, formed of resin, is introduced into the first and second spaces 43 and 44 so as to form the first under-filler resin layer 38 and the second under-filler resin layer 40. The first and second under-filler resin layers 38 and 40 communicate with each other via the through-aperture 35 of the printed wiring substrate 32.

The first under-filler layer 38, introduced into the first space 43, serves to reinforce the bumps 33 and prevents them from being detached from the printed wiring substrate 32 and the motherboard 39, even though a stress resulting from a difference in thermal expansion coefficients therebetween is applied to them.

FIGS. 8 through 11 are diagrams showing a method for producing the above-mentioned semiconductor device 30A and a method for mounting the same on the motherboard 39.

Figure 8A:
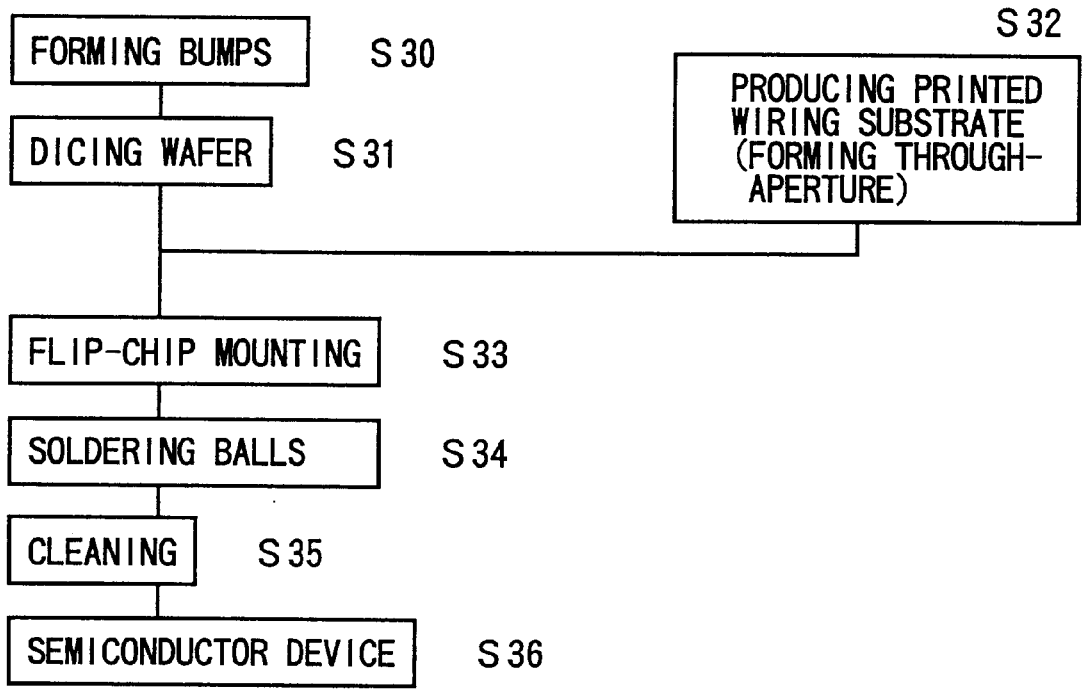
FIGS. 8A and 8B are flowcharts illustrating a producing method of the semiconductor device of FIG. 7 and a mounting method thereof of the first embodiment according to the present invention.

FIG. 8A is a flowchart showing the method for producing the semiconductor device 30A. The producing method of the present invention proceeds as follows.

As shown in this flowchart, firstly, at Step 30 ("Step" simply referred as to "S" in the diagrams), a bump-forming process is performed such that a plurality of the semiconductor chips 31 are produced on a wafer by a well-known producing technology, and then a plurality of bumps 34 are formed on each of these produced semiconductor chips 31. Then, at Step 31, a dicing process is performed for dicing the wafer into individual semiconductor chips 31.

While the above-mentioned Steps 30 and 31 are performed, a process is performed at Step 32 for forming the printed wiring substrate 32 serving as a wiring layer. The printed wiring substrate 32, having a well-known structure made of, for example, glass-epoxy resin, can be easily formed by a well-known substrate-making technology.

Further, during the process for forming the printed wiring substrate 32, the previously described through-aperture 35 is simultaneously formed. As a method of forming the through-aperture 35, the through-aperture 35 may be formed by punching a hole in a predetermined size on materials used to form the printed wiring substrate 32, or may be formed on the printed wiring substrate 32 with a drill, laser or the like. Accordingly, the through-aperture 35 can be thus easily formed.

In addition, as previously described, the through-aperture 35 is formed in an approximately center of a carrying place on which the semiconductor chip 31 is carried.

At Step 33, a flip-chip mounting process is performed for mounting the semiconductor chip 31 on the printed wiring substrate 32 by bonding the bumps 34 provided on the semiconductor chip 31 to the respective bonding pads 36 provided on the printed wiring substrate 32. This is regarded as the primary mounting. At the time of completion of the primary mounting, the through-aperture 35 of the printed wiring substrate 32 faces to the approximately center position of a bottom surface of the semiconductor chip 31.

Figure 3A:
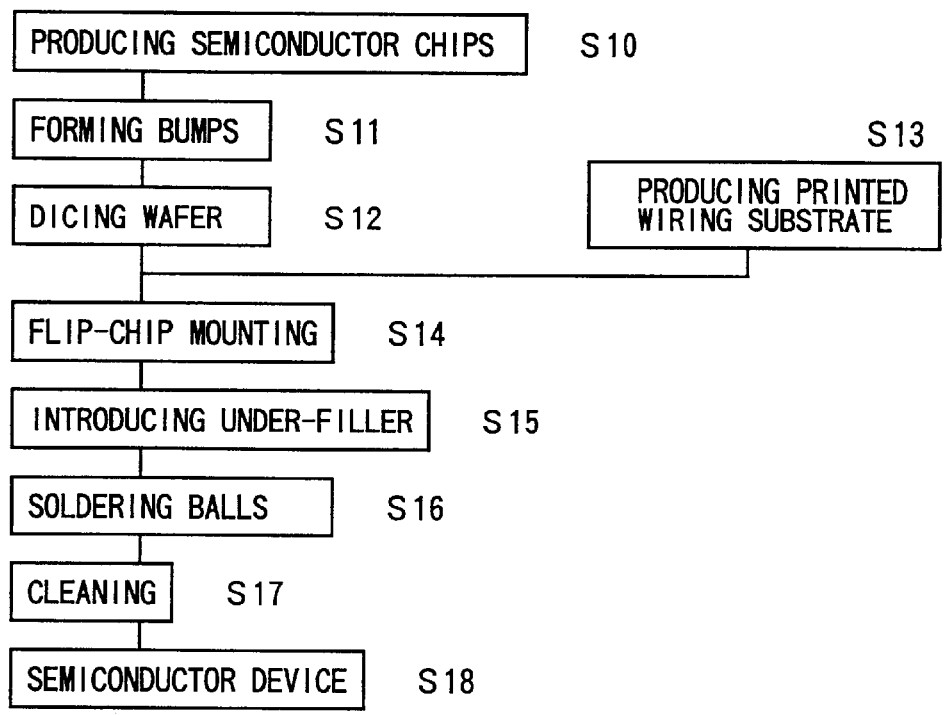
FIGS. 3A and 3B are flowcharts showing a conventional method of producing and mounting the semiconductor device of FIGS. 2A and 2B.
Figure 3B:
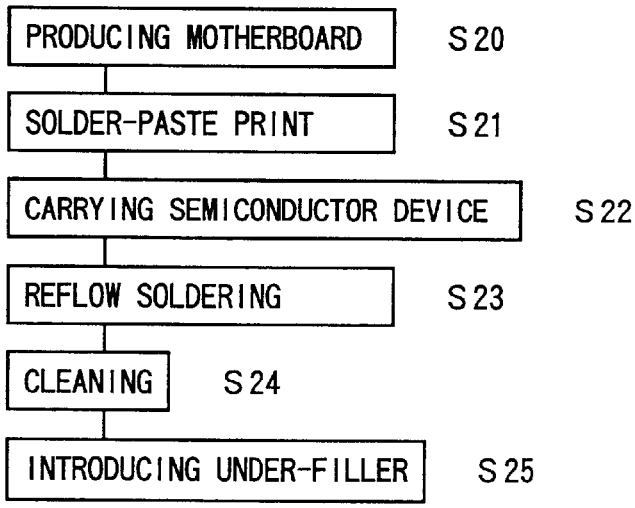
Figure 4:
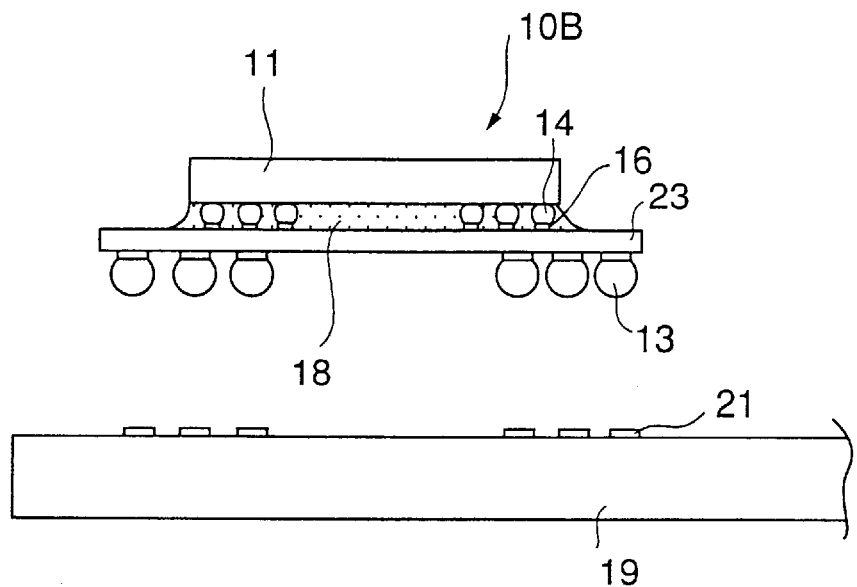
FIGS. 4 through 6 are diagrams showing the mounting process used for mounting the semiconductor device of FIGS. 2A and 2B.
Figure 5:
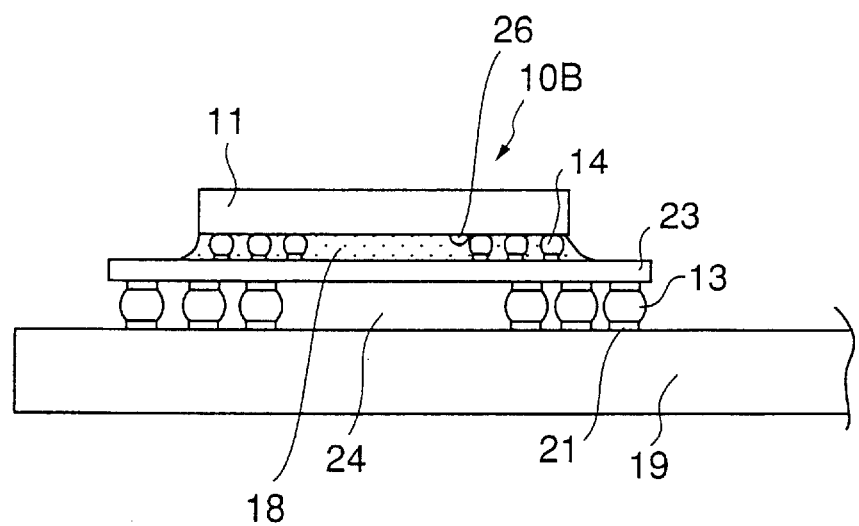
Figure 6:
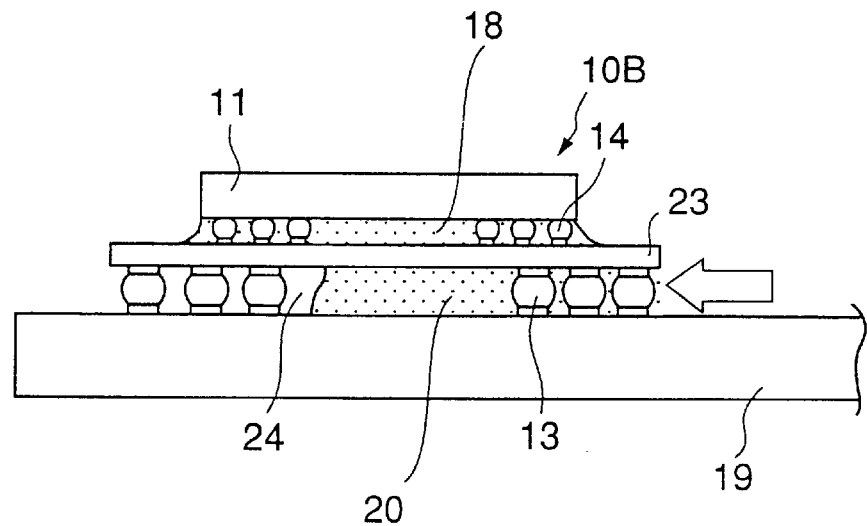

According to the conventional producing method which have been described with reference to FIG. 3A, after the semiconductor chip 11 is mounted on the printed wiring substrate 23 by the flip-chip mounting process, the first under-filler resin layer 18 is formed into the space therebetween (Step 15).

In contrast, the producing method in this embodiment according to the present invention, after Step 33, proceeds to Step 34 without the step of forming the first under-filler resin layer 18.

After Step 33, the flip-chip mounting process (the primary mounting), is completed, at Step 34, a ball soldering process is performed for the soldering the solder ball 33 under the printed wiring substrate 32. Then, at Step 35, a cleaning process is performed so as to remove the solder pastes used for soldering the solder balls 33. Thereafter, the semiconductor device 30A is produced at Step 36.

Figure 8B:
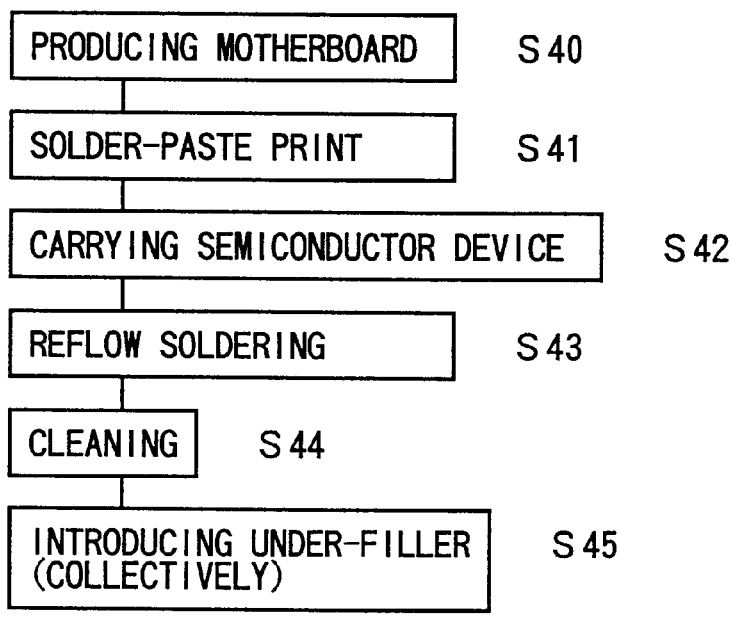

FIG. 8B is a flowchart showing a method for mounting the above-mentioned semiconductor device 30A on the motherboard 39 serving as the printed circuit board. The mounting method of the present invention proceeds as follows.

At Step 40, the motherboard 39 is in advance produced by way of a separate process. The motherboard may be a ceramic substrate, a resin substrate, a built-up substrate or the like.

At Step 41, a solder-paste printing process is performed for printing solder pastes on the connecting electrodes 41 provided on the motherboard 39. The solder-paste printing process may use a well-known screen print.

Then, at Step 42, as shown in FIG. 9, a carrying process for carrying the semiconductor device 30A on the motherboard 39 is performed such that the semiconductor device 30A is positioned with respect to the motherboard 39 so as to make the solder balls 33 opposite to the respective connecting electrodes 41 and then the solder balls 33 are respectively carried on the connecting electrodes 41 with the solder pastes as adhesives. This is regarded as the temporary mounting process.

At Step 43, a soldering process is performed such that the motherboard 39 which carries the semiconductor device 30A thereon is put into a reflow furnace so that the solder balls 33 can be firmly soldered to the respective connecting electrodes 41. By the soldering process, as shown in FIG. 10, the semiconductor device 30A is firmly fixed on the motherboard 39. This step is regarded as the secondary mounting.

Then, at Step 44, the cleaning process is performed so as to remove the solder pastes. At the time of completion of the secondary mounting, as shown in FIG. 10, a second space 44 is formed between the printed wiring substrate 32 and the motherboard 39.

Figure 11:
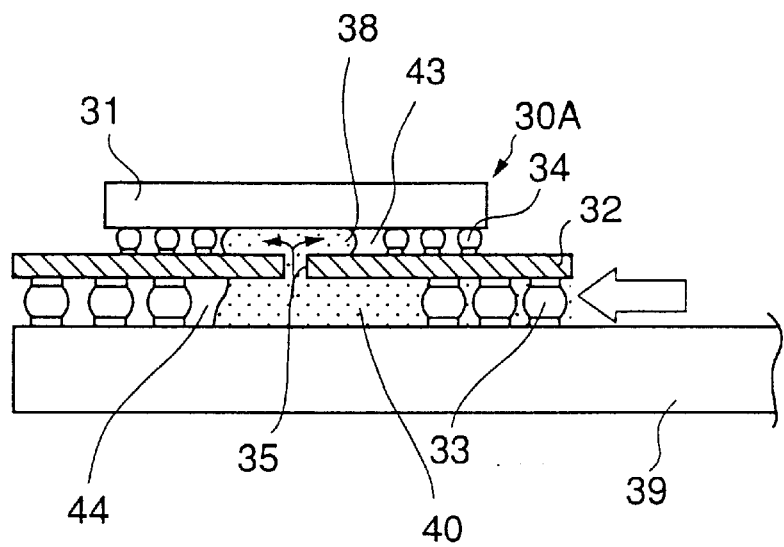

At Step 45, the under-filler introducing process is performed for introducing the under-filler into the first and second spaces 43 and 44 so as to form the first and second under-filler resin layers 38 and 40 therewithin, respectively. FIG. 11 shows a state in which the under-filler used to form the first and second under-filler resin layers 38 and 40 are being introduced into the first and second spaces 43 and 44. The under-filler used to form the first and second under-filler resin layer 38 and 40 may be introduced thereinto with, for example, a dispenser.

In this embodiment, as shown in FIG. 11, the under-filler resin used for forming the first and second under-filler layer 38 and 40 is introduced through the second space 44. It should be noted that the present invention is not limited to this, that is, the under-filler resin may be introduced through the first space 43. However, since the second space 44 is often higher than the first space 43, that the under-filler resin is introduced through the second space 44 is better in terms of resin-introducing efficiency.

Herein, with respect to a resin-introducing flow, as shown in FIG. 11, the resin used for forming the first and second under-filler layer 38 and 40 is introduced from the periphery of the second space 44. Accordingly, the resin flows into the second space 44 from the periphery thereof.

When advancing to the through-aperture 35 of the printed wiring substrate, the resin passes therethrough and enters the first space 43. Thus, in the first space 43 is formed the first under-filler layer 38 and in the second space 44 is formed the second under-filler layer 40.

Also, since the through-aperture 35 is positioned facing to the center of the semiconductor chip 31, the first under-filler layer 38 can be uniformly formed within the first space 43. Further, in a case of a plurality of the through-apertures 35, the first under-filler layer 38 can be formed more efficient.

Thus, by providing the through-aperture 35 on the printed wiring substrate 32, the first under-filler layer 38 and the second under-filler layer 40 can be formed collectively and simultaneously, and therefore the simplification of the producing and mounting of the semiconductor device can be achieved. As a result, the semiconductor 30A can be mounted on the motherboard 39 with better efficiency and at a lower cost.

If the first under-filler layer 38 or the second under-filler layer 40 contains water therein, even the water is changed into water vapor due to an increase in an environmental temperature or a heating process which is performed after the secondary mounting of the motherboard 39, the through-aperture 35 can serves as a path through which the water vapor to flee. In other words, by providing the through-aperture 35 on the printed wiring substrate 32, the water vapor can flee between the first under-filler layer 38 and the second under-filler layer 40.

That is, in a case where the water vapor is generated within the first and second under-filler layers 38 and 40, it can go to flee therebetween. In addition, it is possible for the water vapor to move to a certain extent within the resin used for forming the first and second under-filler layers 38 and 40.

Figure 1A:
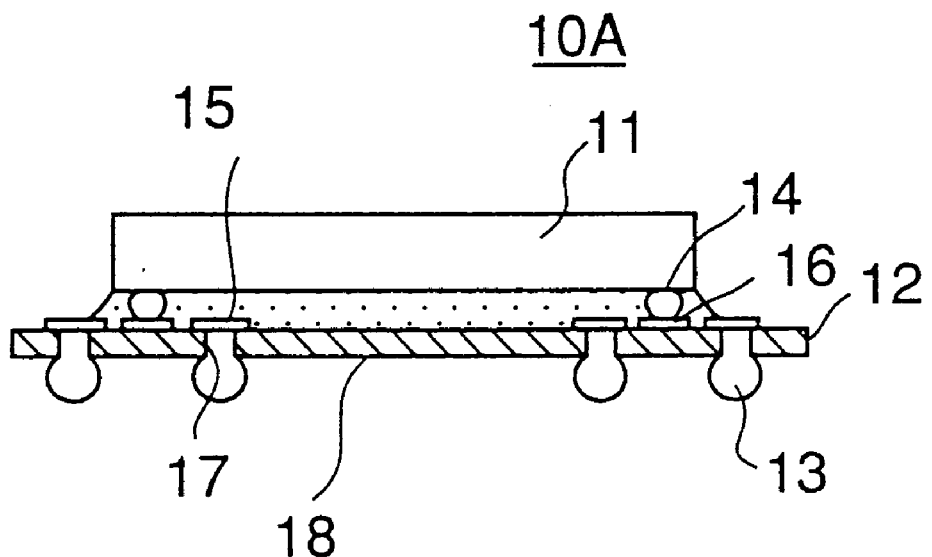
FIGS. 1A and 1B are diagrams showing a conventional semiconductor device and a structure of mounting the same on a printed circuit board.
Figure 1B:
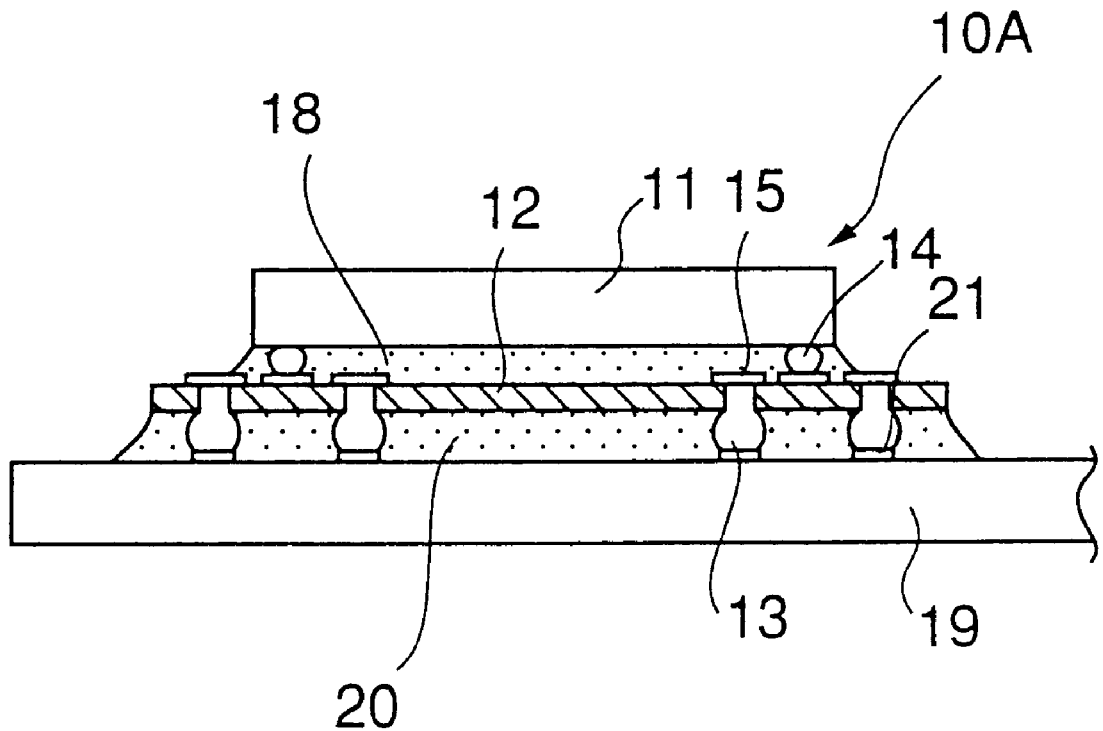
Figure 2A:
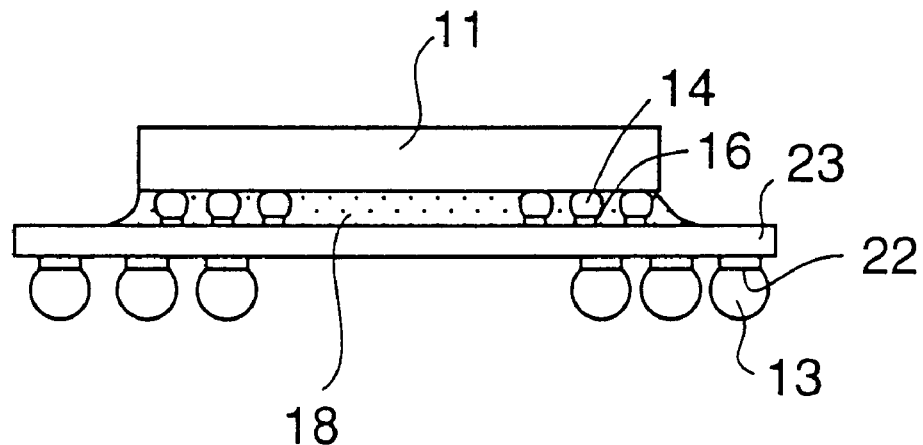
FIGS. 2A and 2B are diagrams showing another conventional semiconductor device and a structure of mounting the same on the printed circuit board.
Figure 2B:
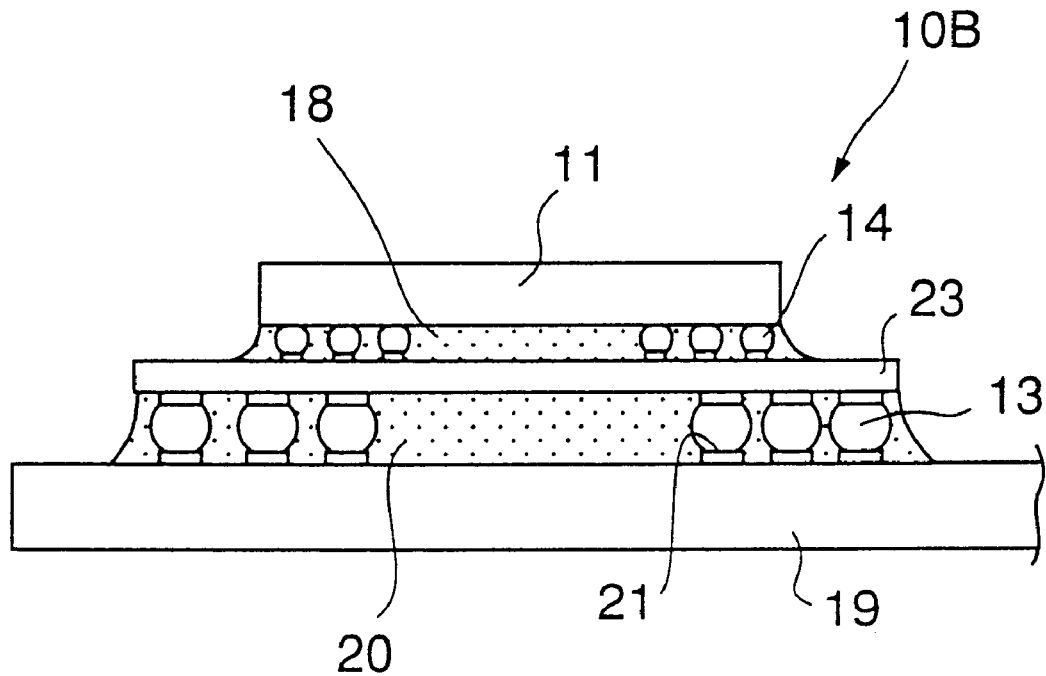

Conventionally, referring back to FIGS. 1 and 2, the first under-filler layer 18 and the second under-filler layer 20 are completely separated by the flexible printed substrate or the printed wiring substrate 23, and therefore the water vapor can move (flee) only within the first under filler 18 or only within the second under-filler layer 20.

In contrast, in this embodiment, since the printed wiring substrate 32 has the through-aperture 35, the generated water vapor can move through the through-aperture 35 between the first under-filler layer 38 and the second under-filler layer 40. Accordingly, the popcorn phenomenon occurring therein can be restrained, and as a result the mounting reliability can be improved.

Figure 12:
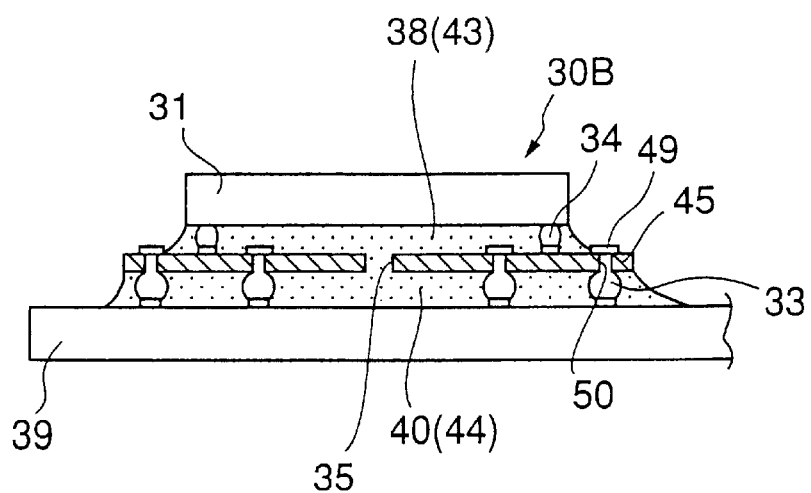
FIG. 12 is diagram showing a mounting structure of a semiconductor device 30B and a mounting method of the same of a second embodiment according to the present invention.
Figure 13:
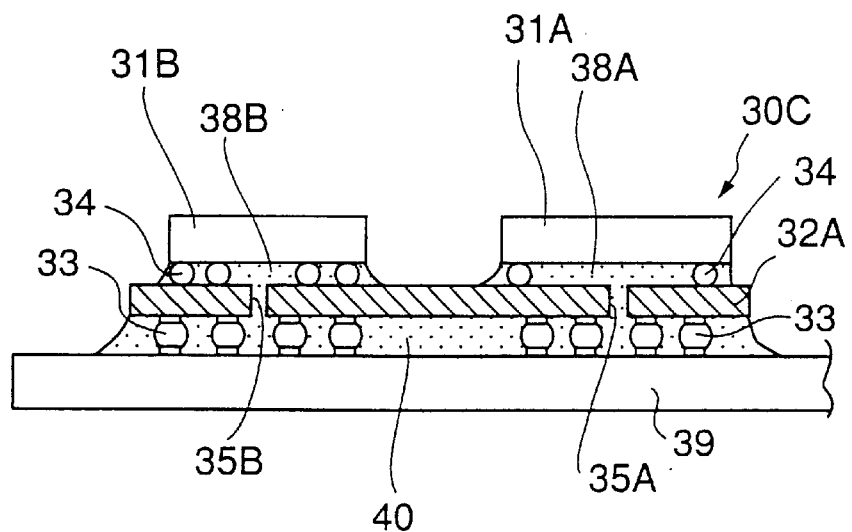
FIG. 13 is diagram showing a mounting structure of a semiconductor device 30C and a mounting method of the same of a third embodiment according to the present invention.
Figure 14:
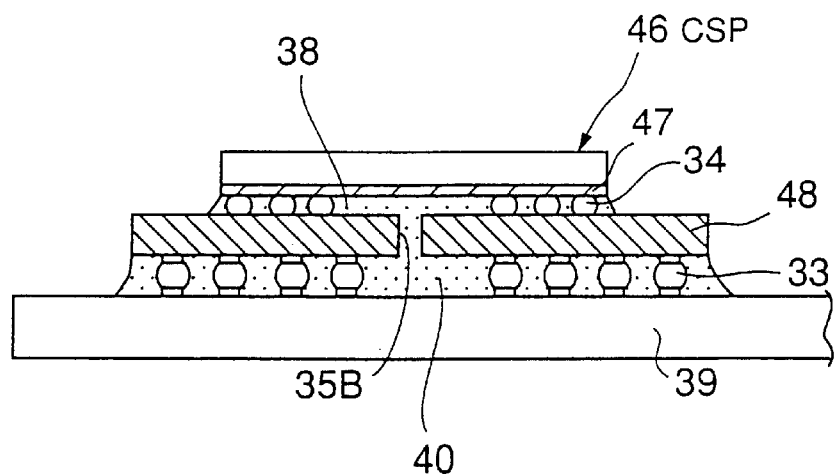
FIG. 14 is diagram showing a mounting structure of a CSP semiconductor device and a mounting method of the same of a fourth embodiment according to the present invention.

FIGS. 12 through 14 are diagrams for illustrating structures and methods for mounting semiconductor devices of a second through fourth embodiments according to the present invention.

FIG. 12 shows the mounting structure of the semiconductor device of the second embodiment according to the present invention. As shown in this diagram, the mounting structure is configured such that a semiconductor device 30B using a flexible substrate 45 is mounted on the motherboard 39.

On the flexible substrate 45, there is the through-aperture 35 formed in a position opposite to the semiconductor chip 31 as described in the first embodiment. The through-aperture 35 is formed together with connecting holes 50 thereon, through which the solder balls 33 are respectively soldered to wiring patterns 49. Accordingly, the through-aperture 35 can be easily formed even in the structure using the flexible substrate 45.

FIG. 13 shows the mounting structure of the semiconductor device of the third embodiment according to the present invention. As shown in this diagram, the mounting structure is regarded as a MCM structure, where a plurality of semiconductor chips 31A and 31B (two in this embodiment) are carried on a printed wiring substrate 32A, and through-apertures 35A and 35B are formed thereon facing to the respective semiconductor chips 31A and 31B.

Even in such a structure where the plurality of the semiconductor chip 31A and 31B are thus mounted on the printed wiring substrate 32A, by forming the through-apertures 35A and 35B thereon, first under-filler layers 38A and 38B can be formed collectively and simultaneously within spaces between the semiconductor chips 31A, 31B and the printed wiring substrate 32A.

Accordingly, comparing with a structure in which the first under-filler layers 38A and 38B are separately formed within the separate semiconductor chips 31A, 31B, the mounting structure of the third embodiment can achieve better efficiency.

FIG. 14 shows the mounting structure of the semiconductor device of the fourth embodiment according to the present invention. As shown in this diagram, the mounting structure is for a CSP semiconductor chip in which a CSP 46 at a wafer level is primarily mounted on a daughter-board 48, and at the same time the daughter-board 48 is secondarily mounted on the motherboard 39.

With respect to the CSP 46 at the wafer level, in a case of multi-pins, the bumps 34, mostly, have to be arrayed at a fine pitch (equal to or lower than 0.4 mm) on a surface mounting. Since such a fine pitch brings about difficulty with the surface mounting, it is hard to directly mount the CSP 46 on the motherboard 39. Accordingly, by using the daughter-board 48 available for the high-density wiring, after fanning out thereon, the CSP 46 is mounted on the motherboard 39.

Even in such a case, by providing the through-aperture 35 on the daughter-board 48, the same effect as those described in the other embodiments can be obtained. In addition, in FIG. 14, reference numeral 47 denotes a resin layer for protecting the bumps 34 and the circuit-forming surface of the semiconductor chip 31.

The above description is provided in order to enable any person skilled in the art to make and use the invention and sets forth the best mode contemplated by the inventions of carrying out their invention.

The present application is based on Japanese priority application No. 11-058963 filed on Mar. 5, 1999, the entire contents of which are hereby incorporated by reference.

What is claimed is:

1. A semiconductor device comprising:

a semiconductor chip having a device surface;

an interconnecting substrate carrying said semiconductor chip in a face-down state, such that said device surface faces a top surface of said interconnection substrate with a gap formed between said device surface and said top surface;

a plurality of connecting terminals provided on a bottom surface of said interconnecting substrate; and at least one through-aperture formed in said interconnecting substrate so as to penetrate from said bottom surface to said top surface, said through-aperture being formed in an area of said interconnecting substrate and covered by said semiconductor chip, wherein said interconnecting substrate carries a plurality of said semiconductor chips thereon, and a plurality of said through-apertures provided thereon in positions opposite to said respective semiconductor chips.

2. The semiconductor device as claimed in claim 1, wherein said semiconductor chip is connected to said interconnecting substrate via protruding electrodes, and said connecting terminals are made up of ball materials.

3. The mounting structure as claimed in claim 4, wherein said semiconductor chip is connected to said interconnecting substrate via protruding electrodes, and said connecting terminals are made up of ball materials.

4. A structure for mounting a semiconductor device, said semiconductor device comprising:

a semiconductor chip having a device surface;

an interconnecting substrate carrying said semiconductor chip in a face-down state, such that said device surface faces a top surface of said interconnection substrate with a gap formed between said device surface and said top surface;

a plurality of connecting terminals provided on a bottom surface of said interconnecting substrate;

at least one through-aperture formed in said interconnecting substrate so as to penetrate from said bottom surface to said top surface, said through-aperture being formed in an area of said interconnecting substrate and covered by said semiconductor chip;

a main substrate to which said connecting terminals face; and a first under-filler layer formed between said semiconductor chip and said interconnecting substrate and a second under-filler layer formed between said interconnecting substrate and said main substrate, communicating with each other via said through-aperture, wherein said interconnecting substrate carries a plurality of said semiconductor chips thereon, and a plurality of said through-apertures provided thereon in positions opposite to said respective semiconductor chips.

5. The mounting structure as claimed in claim 4, wherein said main substrate is a mother board.

6. The mounting structure as claimed in claim 4, wherein said interconnecting substrate is a daughter board.

7. A method for mounting a semiconductor device on a mounting substrate, said semiconductor device including: a semiconductor chip having a device surface; an interconnecting substrate carrying said semiconductor chip in a face-down state, such that said device surface faces a top surface of said interconnection substrate with a gap formed between said device surface and said top surface; a plurality of connecting terminals provided on a bottom surface of said interconnecting substrate; and a main substrate to which said connecting terminals face; said mounting method comprising the steps of:

forming at least one through-aperture in said interconnecting substrate so as to penetrate from said bottom surface to said top surface, said through-aperture being formed in an area of said interconnecting substrate and covered by said semiconductor chip;

connecting said connecting terminals of said semiconductor device to said main substrate; and introducing an under-filler from one of a space between said semiconductor chip and said interconnecting substrate and a space between said interconnecting substrate and said main substrate, and thereby introducing said under-filler layer into the other space via said through-aperture, wherein said interconnecting substrate carries a plurality of said semiconductor chips thereon, and a plurality of said through-apertures provided thereon in positions opposite to said respective semiconductor chips.

8. The mounting method as claimed in claim 7, wherein said semiconductor chip is connected to said interconnecting substrate via protruding electrodes, and said connecting terminals are made up of ball materials.

9. The mounting structure as claimed in claim 7, wherein said main substrate is a mother board.

10. The mounting structure as claimed in claim 7, wherein said interconnecting substrate is a daughter board.

* * * * *